United States Patent [19]

Bird

[11] Patent Number: 4,864,217

[45] Date of Patent: Sep. 5, 1989

[54] METHOD OF AND A CIRCUIT ARRANGEMENT FOR PROCESSING SAMPLED ANALOGUE ELECTRICAL SIGNALS

[75] Inventor: Neil C. Bird, Eindhoven, Netherlands

[73] Assignee: U.S. Philips Corporation, New York, N.Y.

[21] Appl. No.: 244,440

[22] Filed: Sep. 14, 1988

[30] Foreign Application Priority Data

Sep. 16, 1987 [GB] United Kingdom ............... 8721758

[51] Int. Cl.[4] .............................................. G05F 3/24
[52] U.S. Cl. ................................. 323/316; 323/317; 307/353; 307/296.5
[58] Field of Search ............... 323/311, 312, 315, 316, 323/317; 307/352, 353, 238.1, 238.8

[56] References Cited

U.S. PATENT DOCUMENTS

| | | | |
|---|---|---|---|
| 4,323,796 | 4/1982 | Lathrope | 323/316 |
| 4,458,200 | 7/1984 | Geller | 323/316 |
| 4,585,951 | 4/1986 | Wurzburg | 307/353 |
| 4,604,584 | 8/1986 | Kelley | 307/353 |
| 4,694,341 | 9/1987 | Soneda et al. | 307/353 |
| 4,703,249 | 10/1987 | De La Plaza et al. | 323/316 |

Primary Examiner—Peter S. Wong
Attorney, Agent, or Firm—Bernard Franzblau

[57] ABSTRACT

A sampled analog electrical signal in the form of sample currents is processed by combining the input sample current in one sample period with sample currents derived from input sample currents in preceding sample periods. The signal processing is performed by scaling, adding, subtracting and storing sample currents. A circuit arrangement for carrying out the signal processing may be constructed from current mirror circuits and a current memory which is capable of reproducing at its output in one sample period the current applied to its input in a previous sample period.

16 Claims, 4 Drawing Sheets

4,864,217

METHOD OF AND A CIRCUIT ARRANGEMENT FOR PROCESSING SAMPLED ANALOGUE ELECTRICAL SIGNALS

BACKGROUND OF THE INVENTION

This invention relates to a method of and an apparatus for processing sampled analog electrical signals.

For processing analog signals using circuitry which can be easily integrated, the switched capacitor technique has been used. Since it is difficult to integrate large valued resistors because of the area occupied and further the correlation between resistor and capacitor values produced by integration is not good, causing the resultant time constants to be poorly defined, the technique of using the equivalent resistance of a capacitor which is switched into and out of circuit to cause processing to take place by means of manipulation of charge packets has been used for analog signal processing where integration has been required.

Although they are widely used, switched capacitor circuits have certain disadvantages. It is necessary to produce capacitors which are linear, that is their capacitance should not change significantly with the signal level. This has been achieved in CMOS integrated circuits by providing two polysilicon layers for the plates of the capacitors. However, standard CMOS processes used for the integration of digital circuits do not employ a double polysilicon layer . Consequently, switched capacitor circuits which are formed on the same chip as digital circuits require additional processing steps. In switched capacitor circuits the double polysilicon layer switched capacitors, together with the required compensation capacitors for the operational amplifiers, can account for a significant proportion of the total silicon area. This tends to produce relatively large chips. Furthermore in most switched capacitor systems, each amplifier and switch must be individually designed and optimized for its particular environment in order for the circuit to perform adequately.

SUMMARY OF THE INVENTION

It is an object of the invention to provide an analog signal processing circuit which can be more easily integrated.

The invention provides a method of processing sampled analog electrical signals comprising the steps of (a) converting each sample into a current, if it is not already in that form;

(b) combining, in predetermined proportions, the input sample current in the present sample period with current(s) derived from input sample current(s) in one or more preceding sample periods, and (c) deriving the processed output signal from the combined current produced by step(b) in successive sample periods.

The invention is based on the realisation that the quantity manipulated can be current rather than, as is the case with switched capacitor circuits, charge. The choice of current as the manipulated quantity rather than charge characterizes the new technique.

Thus, in a switched capacitor circuit the signal processing is achieved by adding, subtracting or storing electrical charges, whereas in the method according to the present invention the signal processing is achieved by scaling, adding, subtracting or storing electrical currents. Considerable similarities exist in the processing of the electrical quantity, although the actual electrical quantity manipulated is different. In particular all of the mathematics concerned with the application of Z-transforms to switched capacitor circuits is equally valid for those employing current as the manipulated quantity.

The choice of current as the manipulated quantity provides a number of advantages. The technique does not require high quality linear capacitors. As a direct consequence, it may be possible to dispense with the second polysilicon layer used in switched capacitor circuits to fabricate linear capacitors. In that case standard CMOS processes used for the integration of digital circuits may be used for the implementation of circuits employing the new technique. This gives true VLSI compatibility. Large area trouble polysilicon layer switched capacitors are therefore not required and the only requirement for the capacitors for the new technique is in capacitors which have a small value ad have a monotonic charge/voltage relationship, which need not be linear, and which may be realized as gate oxide or diffusion capacitors. Thus, for a given function the implementation will be smaller than its switched capacitor counterpart. Further reduction in the chip area may also result from the use of smaller geometry MOS processes. Circuits designed in older, coarser, processes may be able to take advantage of developments in mask making and etching technologies by geometric shrinkage of the layout. Geometric shrinkage is not generally feasible in switched capacitor circuits since circuit parameters, such as amplifier settling time and switch resistance, can change detrimentally even though the channel width/length ratio of the MOS devices is held constant.

In a switched capacitor system, each amplifier and switch must be individually designed and optimized for its particular environment in order for the circuit to perform adequately. In contrast with circuits utilising the method according to the present invention, the nature of operation allows the two basic circuit elements required, that is a family of low input impedance high output impedance current mirrors and analogue memory, to be designed once only for each IC process. It will, of course, be necessary to design a separate current mirror for each scaling factor. Thus, once a particular system configuration has been determined, the time spent on circuit design for implementation in the new technique may be significantly reduced compared with that required for a switched capacitor approach. The independent cellular nature of the circuitry provided by the present invention opens the way to apply semi-custom design procedures.

The principal disadvantages of this technique is a consequence of its discrete time operation. As in a switched capacitor signal processing system or any system in which signal sampling is performed, some form of anti-aliasing filtering is required before the first sample and hold operation. Apart from representing an increase in complexity of total circuit function, the VLSI compatibility of the technique is threatened if the anti-alias filter requires a second polysilicon layer or other process modification for its monolithic implementation.

However, it should be noted that the invention relates to a method of processing sampled analog electrical signals in the form of electrical currents and could be implemented in alternative integrated circuit technologies, for example bipolar, galium arsenide, or even by means of circuits constructed with discrete components.

The invention further provides a circuit arrangement for processing sampled analog electrical signals, each sample being in the form of a current, the circuit arrangement comprising means for combining in predetermined proportions the input sample current in the present sample period with current(s) derived from input sample current(s) in one or more preceding sample periods, and means for deriving the processed output signal as or from the combined current produced by the combining means in successive sample periods.

Means may be provided for holding the input sampled current constant for a given portion of the sample period.

This enables signal combination to take place during the given portion, allowing time for the signals to settle, and defines a time during each sample period for which the output signal is valid.

The combining means may comprise means for storing the combined current formed during one sample period and means for making available the stored current for combination in a predetermined proportion with the input sample current during the next sample period.

Thus, in each sample period the input sample current may be combined with a current stored in the previous sample period and the combined current may then be stored for combination with the input current sample in the next sample period.

The storage means may comprise a current memory, the current memory comprising input means for receiving an input current during the given portion of the present sample period, means for generating an output current during the given portion of a subsequent sample period having a magnitude dependent on the input current during the present sample period, said generating means comprising means for decoupling the input and output currents of the current memory during the remainder of each sample period, and means for maintaining the value of the output current set by the input current during the given portion of the present sample period for the remainder of the present sample period. The current memory may comprise a current mirror circuit means for decoupling the input and output current branches of the current mirror circuit and means for maintaining the current in the output branch when the input and output branches are decoupled, the output of the current memory being available when the input and output branches are decoupled. By enabling the input and output branches of the current mirror to be decoupled, the control voltage generated by the input branch can be stored and applied to the output branch when the input and output branches are decoupled to cause the stored current to be generated by the output branch.

The current memory may comprise first and second current mirror circuits, each current mirror circuit including means for decoupling its input and output current branches and means for maintaining the current in the output branch when the input and output branches are decoupled, means for applying the output current from the first current mirror circuit to the input branch of the second current mirror circuit, and means for deriving the output current of the current memory from the output branch of the second current mirror in a portion of the sample period when its input and output current branches are decoupled, wherein the input and output branches of the first and second current mirror circuits are coupled for respective non-overlapping periods in each sample period, The first current mirror being coupled during at least a portion of the given period of the sample period and the second current mirror circuit being coupled for at least a portion of the remainder of the sample period.

This two stage memory enables the output current to be made available with a constant value during the given portion of a sample period. It is, of course, possible to arrange for a longer period of storage than one sample period by choosing appropriate clock signals for determining the non-overlapping periods for which the input and output branches are coupled, i.e. The coupling could alternatively be performed only at intervals of more than one sample period.

The output branch of the (or each) current mirror may comprise a field effect transistor, the current maintaining means comprising a capacitor connected between its gate and source electrodes.

As there is a very high impedance between the gate and source electrodes of a field effect transistor the charge on the capacitor can be maintained for long periods, particularly in comparison with the sampling period. Thus, the gate-source voltage of the FET in the output branch, set when the input and output branches are coupled, is maintained by the capacitor when the input and output branches are decoupled. The leakage of the capacitor and the input impedance of the FET will determine the maximum length of time for which an output current will remain sufficiently close to the required value. Depending on the clock frequency it may be necessary to construct this capacitor in a form which has a low leakage current.

BRIEF DESCRIPTION OF THE DRAWINGS

An embodiment of the invention will now be described, by way of example, with reference to the accompanying drawings, in which.

DESCRIPTION OF THE PREFERRED EMBODIMENTS

Figure 1:
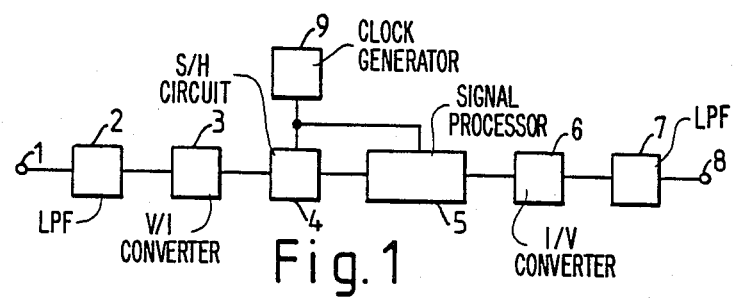
FIG. 1 shows a signal processing circuit arrangement according to the invention where the input and output signals comprise voltages.

As shown in FIG. 1, the circuit arrangement has an input 1 which is fed to a low-pass filter 2, if the signal is not naturally band limited, which acts as an anti-alias filter. The output of the filter 2 is fed to a voltage-to-current converter 3 which could alternatively be combined with the filter 2. The voltage-to-current converter 3 would of course be omitted if the input signal was in the form of a current. The output of the voltage-to-current converter 3 is fed to the input of a sampleand-hold circuit 4. This produces a sampled input for a signal processing circuit 5. The sample-and-hold circuit 4 could alternatively be placed before the voltage-to-current converter 3. The output of the sampled signal processing circuit 5 is fed to a current-to-voltage converter 6 whose output is passed through a low-pass filter 7 to the output 8 of the arrangement.

The sampled signal processing circuit 5 is arranged to manipulate sampled currents to produce the desired output signal. The precise form of the signal processing circuit 5 will depend on the signal manipulation to be performed. It may, for example, comprise one or more integrator circuits such as that shown in FIG. 2. A clock generator 9 feeds the sample and hold circuit 4 and the signal processing circuit 5. The signal processing circuit 5 uses the clock from the clock circuit 9 to synchronize its processing with the delivery of sample currents from the output of the sample-and-hold circuit 4.

The signal manipulation is carried out by combining, in desired proportions, the electrical current in the present sample period with the electrical currents in one or more preceding sample periods. Consequently, the signal processing circuit 5 must be capable of making available the currents from at least the preceding sample period. This does not, however, mean that the input current in the preceding sample period must itself be available, but merely that the manipulated current for the previous sample period be available together with the current in the present sample period.

If the input signal is in the form of a current then the voltage-to-current converter may be omitted and similarly if the input signal is in a different form an appropriate converter would be substituted for the voltage-to-current converter, for example a temperature-to-current converter or a current produced by a digital-to-analogue converter. Similarly, the current-to-voltage conversion could be replaced by appropriate converter circuits to convert into the output signal variable desired.

Figure 2:
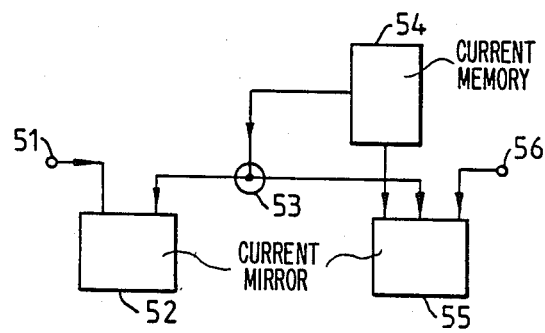
FIG. 2 shows one embodiment of the portion of FIG. 1 where the signal manipulation by the method according to the invention occurs, this portion being arranged as an integrator.

FIG. 2 shows an example of a signal processing circuit suitable for use as the signal processing circuit 5. The circuit arrangement shown in FIG. 2 acts as an integrator. A current applied to the input 51 of the integrator shown in FIG. 2 is fed to the input of a current mirror 52. The output of the current mirror is fed to a summing node 53, to which the input of a current memory 54 and an output of a current mirror 55 are also connected. The output of the current memory 54 is connected to the input of the current mirror 55 while a second output of the current mirror 55 is connected to the output 56 of the integrator.

In operation, current samples are fed to the input 51 and the input current sample is reproduced at the output of the current mirror 52. Assuming that the integrator is reset to zero, when the first current pulse occurs it is stored in the current memory 54. The input current sample applied to the input 51 in the next sample period will then be summed with the current at the output of the current mirror 55. The current at the output of the current mirror 55 will be that stored in the current memory 54 during the previous sample period. The summed current at the summing node 53 is then fed to the input of current memory 54. Thus during the first sample period the output of the integrator will be at zero. During the second sample period, the output of the current memory 54 will be equal to the current applied during the first sample period and hence the output of the integrator will also be equal to the current applied during the first sample period. Also, during the second sample period the input of the current memory 54 will receive the sum of the current during the second sampling period and the current during the first sampling period derived from the output of the current memory 54 ad hence during the third sampling period the output of the integrator, which is assumed equal to the output of the current memory 54, will be equal to the current during the first sampling period plus the current during the second sampling period. Thus this arrangement will continuously add the sample currents in successive sample periods and produce at the output the sum of the currents in each of the sampling periods that have occurred since the integrator was reset. This assumes that the gains of both current mirrors 52 and 55 are equal to one. Clearly this is not necessarily the case and the gains can be chosen to give a desired characteristic to the integrator. For example, a lossy integrator can be provided if the gain of current mirror 55 is set to be less than one. If it is assumed that the gain of the current mirror 52 is equal to $\alpha$ and the gain of the current mirror 55 is equal to $\beta$ and that n sampling periods have elapsed since the integrator was set to zero, then the current output of the integrator during the nth period will be $$I_{OUT}(n) = \beta \times I_{OUT}(n-1) + \alpha I_{IN}(n-1).$$

Figure 5:
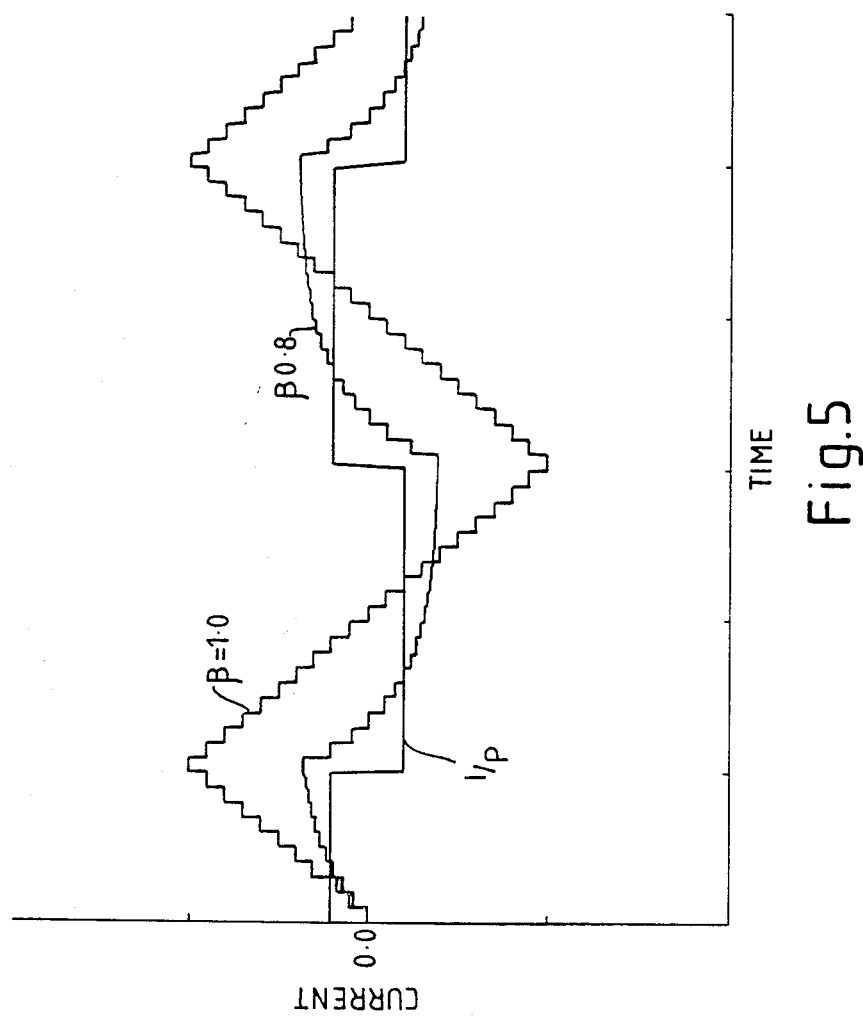
FIG. 5 shows curves illustrating the response of the integrator shown in FIG. 4.

FIG. 5 shows the response of the integrator shown in FIG. 2 where $\alpha$ is set to 0.5 and in the first case $\beta$ is set to 1 and in the second case $\beta$ is set to 0.8. The first case illustrates an ideal integrator and the second a lossy integrator.

Figure 3:
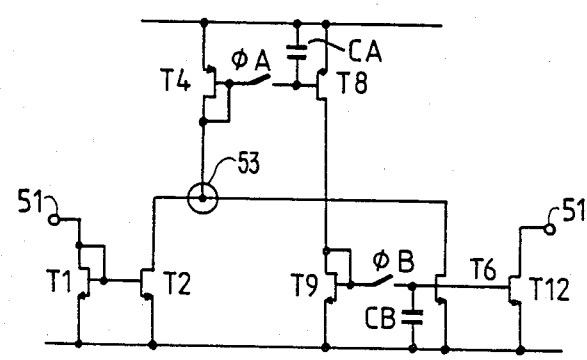
FIG. 3 is a transistor level circuit of the arrangement shown in FIG. 2.

FIG. 3 is a transistor level circuit diagram of an integrator of the form shown in FIG. 2. As shown in FIG. 3 the current mirror 52 is formed from two field effect transistors (FETs) T1 and T2. The output of the current mirror 52, which is formed by the drain of transistor T2, is connected to the summing junction 53. The source of transistor T4 is the input of the current memory 54. The current memory comprises the transistors T4, T8, T6, and T9; the capacitors CA and CB; and two switches $\phi A$ and $\phi B$. The switches $\phi A$ and $\phi B$ are operated by pulses from the clock generator 9 (see FIG. 2). These pulses are non-overlapping and occur at the sampling rate, that is there is a $\phi A$ and a $\phi B$ pulse in each sample period. Assuming that the integrator is reset, the input signal current applied in one sampling period to the input 51 is mirrored at the output of transistor T2 and applied to the summing junction 53 and hence to the input of the current memory 54. During a first portion of the sample period, the switch $\phi A$ is closed and hence the transistor T8 will mirror the current applied to the transistor T4. At the same time the capacitor CA will charge to the gate/source potential of the transistor T8 and also of the transistor T4. When the switch $\phi A$ is opened at the end of the first portion the charge on the capacitor CA maintains the gate/source potential of transistor T8 and hence the current flowing through it. During a second non-overlapping portion of the sample period the switch $\phi B$ is closed and the transistors T9 and T6 then form a current mirror, transistor T9 being the input branch and transistor T6 the output branch. During the period when the switch $\phi B$ is closed, the output current produced by transistor T6 mirrors the input current applied to transistor T9 and at the same time the capacitor CB is charged to the gate-source potential of the transistor T6. Consequently, when the switch φB opens, the current through transistor T6 is maintained by the voltage stored on the capacitor CB. Thus, the output for period (n−1) is held on transistor T6 until the period φB in the sampling period n. The gate-source potential of transistor T12 is also determined by the charge on capacitor CB and the output current of the integrator is derived from the current through transistor T12. This will be proportional to the current through transistor T6. The constant of proportionality depending on the dimensions of transistors T6 and T12.

In the embodiment shown in FIG. 3, the current mirror 52 is formed by transistors T1 and T2; the current memory 54 is formed by transistors T4, T8, T6, T9, capacitors CA and CB, and switches φA and φB; and the current mirror 55 is formed by the capacitor CB and transistors T6 and T12. During the period φB the transistor T9 also forms a part of the current mirror 55.

Figure 4:
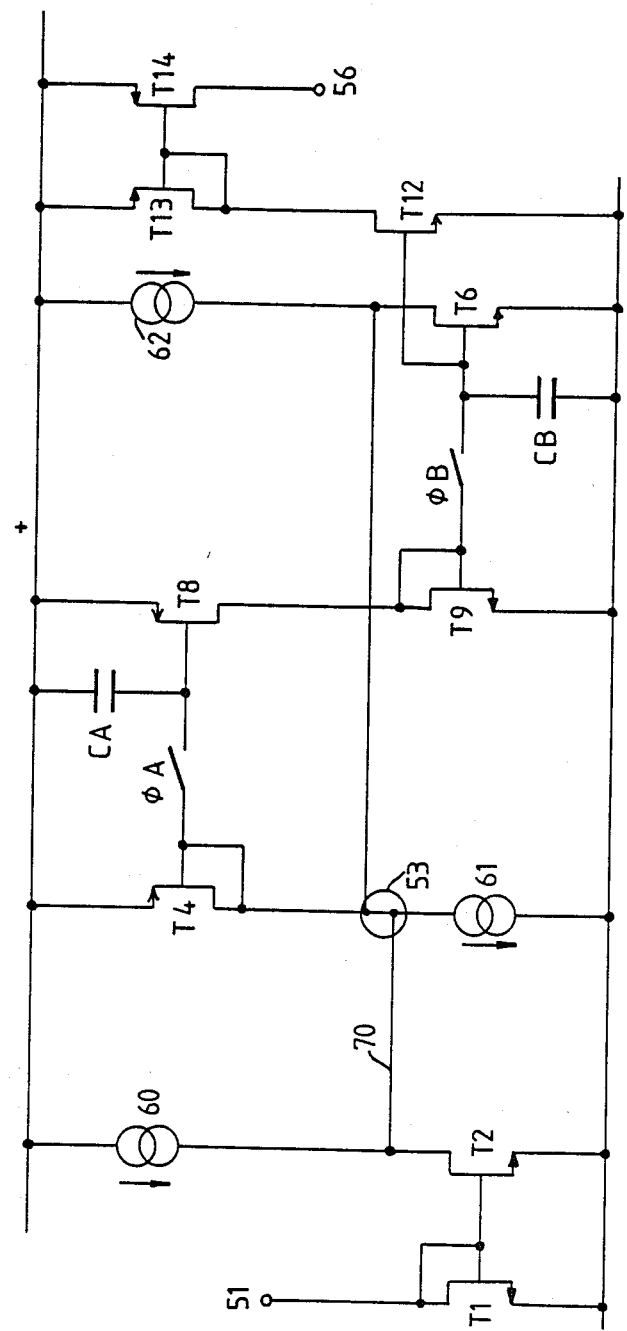
FIG. 4 is a second transistor level arrangement of the circuit shown in FIG. 2 having provision for signals of both positive and negative polarity.

The circuit shown in FIG. 3 is suitable only for currents which are uni-directional. In order to operate with signals which have positive and negative values with respect to a reference and thus give rise to bi-directional input currents, the input current is added to a bias current $I_{bias}$ which allows the input current to have a peak to peak range of $\pm I_{bias}$, assuming that the circuits are designed to handle a peak current of $2I_{bias}$, while presenting a unidirectional current to the input 51. The arrangement shown in FIG. 4 is similar to that shown in FIG. 3 but is provided with additional sources of bias current to enable a bi-directional input current superimposed on a bias current to be processed and an output to be produced having a similar form, i.e. a bi-directional signal current superimposed on the bias current $I_{bias}$. In FIG. 4, those components having the same function as components in FIG. 3 have the same reference symbols.

The circuit shown in FIG. 4 has a current source 60 connected between the drain of transistor T2 and the positive supply rail. The current source 60 provides a current $\alpha I_{bias}$, where $\alpha$ is the gain of the current mirror comprising transistors T1 and T2. Consequently if an input current $I_{bias}+i$ is applied to input 51 a current $\alpha i= \alpha(I_{bias}+i)-\alpha I_{bias}$ is fed to the summing junction 53 over line 70. A further current source 61 is connected between the negative supply rail and the summing junction 53. Since the current $\alpha i$ is bi-directional it is necessary to superimpose it on a bias current to prevent the diode connected transistor T4 at the input of the current memory from being reverse biassed. The current source 61 is arranged to produce a current $I_{bias}$ which is added to the current $\alpha i$ on the line 70. The current memory 54 comprises first and second switched current mirrors formed by transistors T4 and T8 and T9 and T6, respectively. The second current mirror formed by transistors T9 and T6 also form the current mirror 55 and is arranged so that transistor T6 produces the current $\beta I_{mem}$ and that transistor T12 produces the current $I_{mem}$. The current $I_{mem}$ is equal to $i_{o+Ibias}$ where $i_o$ is the integrated input current.

Since the current $I_{mem}$ includes the bias current and hence the current $\beta I_{mem}$ includes $\beta I_{bias}$ from the current produced by transistor T6 and fed back over line 72 to the summing junction 53 to prevent the bias current from being integrated as well as the signal current. Consequently, a current source 62 is connected between the positive supply rail and the drain of transistor T6, the current source 62 being arranged to produce the current $\beta I_{bias}$ which is subtracted from the current produced by transistor T6.

It should be noted that the current ratio between transistors T9 and T12 is 1:1 and hence the current produced by transistor T12 is equal to $I_{mem}$ and consequently is $i_{o+Ibias}$. The current mirror formed by transistors T13 and T14 is arranged to have a 1:1 current ratio and is provided merely to invert the direction of the output current to match that of the input current. Its presence is optional depending on the function required and consequently the output current may be taken from the drain of transistor T12 of inversion where the output current with respect to the input is required.

For best performance, the current mirrors 52 and 55 should have a high output impedance. For the sake of simplicity in the drawings, the current mirrors have been shown as a simple transistor pair. However, a cascoded connection of transistors in the current mirror may be used to increase the output impedance of the current mirrors. Two such current mirrors have been disclosed in U.S. Pat. Nos. 4,550,284 and 4,583,037. A further cascoded current mirror which could be used in the arrangement shown in FIG. 2 is shown in FIG. 6.

Figure 6:
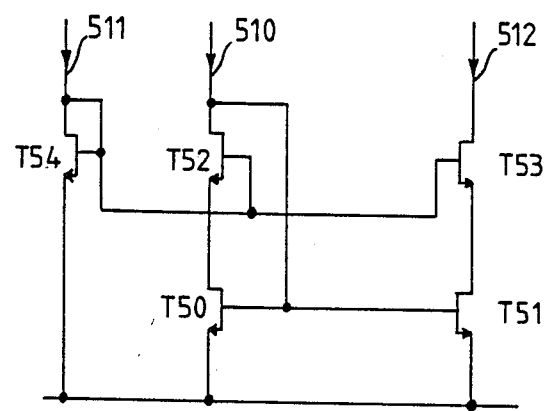
FIG. 6 shows an embodiment of a current mirror suitable for use in the signal processing circuit arrangement according to the invention.

The current mirror circuit shown in FIG. 6 has an input on line 510. The current mirror is formed by two cascoded transistors T50 and T52 in the input branch and two further cascoded transistors T51 and T53 in the output branch, the output being derived from line 512. A further branch comprising a transistor T54 and having an input on line 511 is provided to produce a bias current for the transistors T52 and T53. The transistor T54 has a gate width to length ratio of a quarter of that of the transistors T2 and T53. It is possible to extend the cascoding of the transistors in the branches of the current mirror. A third cascoded transistor may be connected, in which case a further bias branch is required to bias the third transistors in the input and output branches. The transistor in the further bias branch having a gate width to length ratio of 1/9the of that of the third transistors. These biassing arrangements give a maximum dynamic range for the input signals to the current mirror. If a maximum dynamic range is not required the cascoded transistors may be fed from a fixed bias potential. A further modification which may be made to the current mirrors to improve their performance is dynamic element matching by means of which the input and output branches are continuously interchanged at a given clock rate and an average output current derived. This technique may be used to compensate for mismatching in the transistors between the two branches of the current mirror. Dynamic element matching has been described in a article entitled "Dynamic Element Matching puts Trimless Converters on Chip" by Rudy van der Plassche in "Electronics" dated 16the June 1983.

The invention has been described with application to both an ideal and a lossy integrator, however the field of application of the invention extends beyond this particular type of circuit. For example, any signal processing circuit which can be fabricated by means of switched capacitor techniques will have an equivalent arrangement using the technique according to the invention, which is referred to herein as the switched current technique. Thus the manipulation of charges in a switched capacitor type circuit can be replaced by the manipulation of currents in a switched current type circuit. Just as charges can be added and subtracted on a sampled basis, so can currents be added and subtracted on a sampled basis.

From reading the present disclosure, other modifications will be apparent to persons skilled in the art. Such modifications may involve other features which are already known in the design, manufacture and use of sampled analog electrical signal processing systems and devices and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of processing sampled analogue electrical signals comprising the steps of
   (a) converting each sample into a current if it is not already in that form;
   (b) combining, in predetermined proportions, a input sample current in the present sample period with sample current(s) derived from input sample current(s) in one or more preceding sample periods; and
   (c) deriving a processed output signal from a combined current produced by step b) in successive sampling periods.

2. A method as claimed in claim 1 comprising the steps of storing the combined current formed in step (b) during one sampling period and making available the stored current for combination in a predetermined proportion with the input sample current during a next sampling period.

3. A method as claimed in claim 2 in which step (a) further comprises holding the current constant throughout a given portion of the sample period and step (b) is carried out during the given portion.

4. A method as claimed in claim 1 in which the combined current is formed by current addition.

5. A method as claimed in claim 1 in which the combined current is formed by current subtraction.

6. A method as claimed in claim 1 further comprising the steps of converting the output signal produced in step (c) to a continuous voltage signal.

7. A circuit for processing sampled analogue electrical signals, each sample being in the form of a current, the circuit comprising: means for combining, in predetermined proportions, an input sample current in a present sample period with current(s) derived from input sample current(s) in one or more preceding sample periods, and means for deriving a processed output signal from a combined current produced by the combining means in successive sample periods.

8. A circuit as claimed in claim 7 further comprising means for holding the input sampled current constant for a given portion of the sample period.

9. A circuit as claimed in claim 8, wherein the combining means comprises means for storing the combined current formed during one sample period and means for making available the stored current for combination in a predetermined proportion with the input sample current during next sample period.

10. A circuit as claimed in claim 9 wherein the storing means comprises a current memory, the current memory comprising input means for receiving an input current the given portion of a present sample period, means for generating an output current during the given portion of a subsequent sample period having a magnitude dependent on the input current during the present sample period, said generating means comprising means for decoupling the input and output currents of the current memory during the remainder of each sample period and means for maintaining the value of the output current set by the input current during the given portion of the present sample period for the remainder of the present sample period.

11. A circuit as claimed in claim 10 wherein the current memory comprises a current mirror circuit for decoupling input and output current branches of the current mirror circuit and means for maintaining a current in the output branch when the input and output branches are decoupled, the output current of the current memory being available when the input and output branches are decoupled.

12. A circuit as claimed in claim 9 wherein the storing means comprises a current memory, the current memory comprising first and second current mirror circuits, each current mirror circuit including means for decoupling its input and output current branches and means for maintaining a current in the output branch when the input and output branches are decoupled, means for applying an output current from the first current mirror circuit to the input branch of the second current mirror circuit, and means for deriving the output current of the current memory from the output branch of the second current mirror in a portion of the sample period when its input an output current branches are decoupled, wherein the input and output branches of the first and second current mirror circuits are coupled for respective non-overlapping periods in each sample period, the first current mirror being coupled during at least a portion of the given period of the sample period and the second current mirror circuit being coupled for at least a portion of the remainder of the sample period.

13. A circuit as claimed in claim 11 wherein the output branch of the current mirror circuit comprises a field effect transistor and the current maintaining means comprises a capacitor connected between gate and source electrodes of said transistor.

14. A circuit as claimed in claim 7 wherein the combining means comprises a current summing 15. A method as claimed in claim 1 in which step (a) further comprises holding the current constant throughout a given portion of the sample period and step (b) is carried out during the given portion.

16. A circuit as claimed in claim 7, wherein the combining means comprises means for storing the combined current formed during one sample period and means for making available the stored current for combination in a predetermined proportion with the input sample current during a next sample period.

* * * * *

UNITED STATES PATENT AND TRADEMARK OFFICE
CERTIFICATE OF CORRECTION

PATENT NO. : 4,864,217
DATED : September 5, 1989
INVENTOR(S) : NEIL C. BIRD

It is certified that error appears in the above—identified patent and that said Letters Patent is hereby corrected as shown below:

Column 9 ;
Claim 1, line 29, change "a" to --the--;
        line 30, change "the" to --a--.
Column 10:
Claim 9, line 6, after "during" insert --a--.

Claim 10, line 10, after "rent" insert --during--.

Claim 12, line 41, change "an" to --and--.

Claim 14, line 55, after "summing" insert --node--.

Signed and Sealed this

Twenty-eighth Day of April, 1992

Attest:

HARRY F. MANBECK, JR.

Attesting Officer

Commissioner of Patents and Trademarks